United States Patent [19]

Soboleski

[11] Patent Number: 5,021,925

[45] Date of Patent: Jun. 4, 1991

[54] ELECTRICAL ISOLATOR DEVICE

[75] Inventor: Thomas F. Soboleski, East Haddam, Conn.

[73] Assignee: Nuarms, Inc., Meriden, Conn.

[21] Appl. No.: 496,247

[22] Filed: Mar. 20, 1990

[51] Int. Cl.$^5$ ............................................. H05K 7/20
[52] U.S. Cl. ................................... 361/386; 165/80.3;
357/81; 361/383; 363/141
[58] Field of Search .......................... 165/80.3, 185;
174/16.3, 138 G; 357/81; 361/383, 386, 388,
389; 363/141

[56] References Cited

U.S. PATENT DOCUMENTS

| 3,377,524 | 4/1968 | Bock et al. | 361/388 |
| 4,639,759 | 1/1987 | Neidig et al. | 174/16.3 |
| 4,739,449 | 4/1988 | Kaufman | 361/388 |
| 4,788,626 | 11/1988 | Neidig et al. | 361/386 |

Primary Examiner—Gregory D. Thompson
Attorney, Agent, or Firm—Ailes, Ohlandt & Greeley

[57] ABSTRACT

An electrical isolator device which comprises at least one heat sink (steel plate), and a non-conductive housing which partially encases the heat sink, such that at least one surface of the heat sink is in contact with the non-conductive housing; whereby the surfaces of the heat sink which are not in contact with the non-conductive housing are exposed to the atmosphere to allow dissipation of heat therefrom.

13 Claims, 4 Drawing Sheets

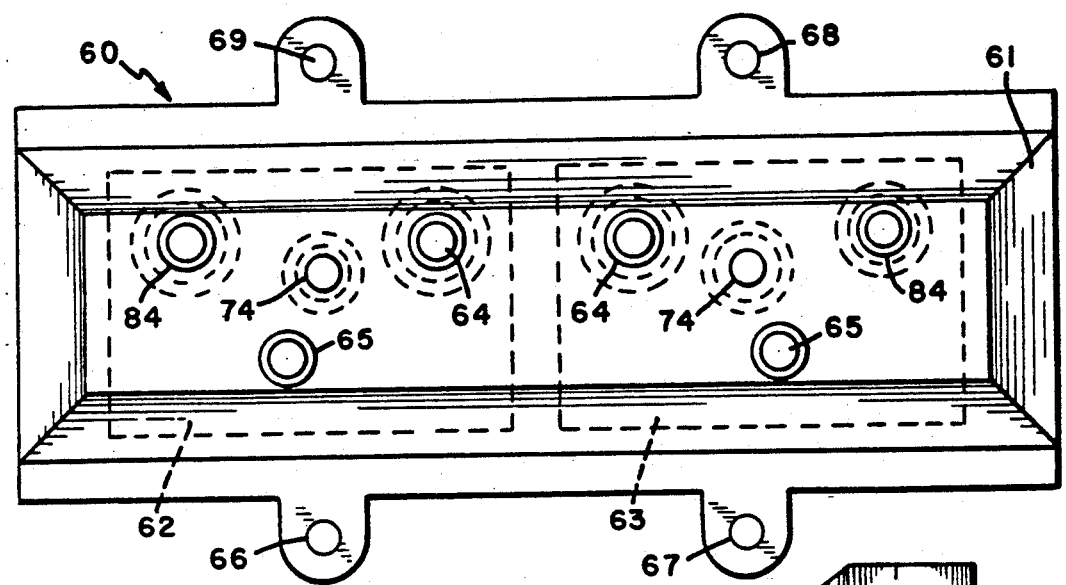
FIG. 7
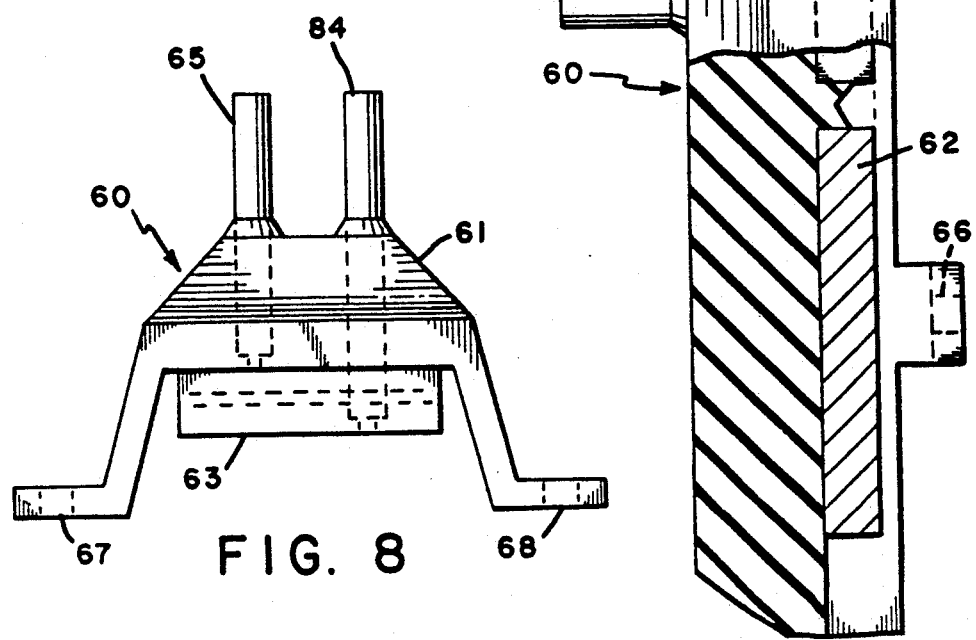
FIG. 9
FIG. 8

ELECTRICAL ISOLATOR DEVICE

The present invention relates to a novel electrical isolator which allows direct connection between an electric current source and a power source. For example, an electrical isolator can be disposed between an engine alternator and at least two batteries without fear of overcharging or of one higher charged battery discharging into the lower charged battery. This device is particularly useful in marine and multiple engine operations.

BACKGROUND OF THE INVENTION

Isolators are typically automatic solid state devices which allow a user to connect an engine alternator directly to two or more batteries simultaneously. Isolators avoid overcharging or discharging by a higher charged battery into a lower charged battery.

For example, battery isolators are typically disposed between the alternator of an engine and multiple batteries in such a manner as to permit electrical current to flow only in one direction, i.e., from the alternator to the batteries via the isolator. During the operation of the engine, each battery is electrically isolated from the other and charged independently.

One conventional electrical isolator includes a finned anodized aluminium extrusion with a central holding area. FIGS. 10 and 11 depict such an electrical isolator 1 which includes an aluminium extrusion 2, central holding area 3, metal stud 4 and diodes 5. Central holding area 3 contains a metal plate (heat sink) 6 in which metal stud 4 and diodes 5 are either press fit and/or screwed therein.

A thermally conductive layer 7 is disposed about the walls of central holding area 3 in order to electrically isolate aluminium extrusion 2 from metal plate 6, while permitting heat conductivity therebetween. That is, heat from metal plate 6 is conducted from central holding area 3 via thermally conductive layer 7 to aluminium extrusion 2 which acts as a cooling system, i.e., heat is dissipated from the isolator assembly via the finned members of aluminium extrusion 2.

Aluminium end caps 8 and 9 are disposed at opposite ends of central holding area 3. Once aluminium end caps 8 and 9 are in place an epoxy filler 10 is poured into central holding area 3 for the purpose of isolating stud 4, diodes 5, metal plate 6 and thermally conductive layer 7 from outside contact. Epoxy filler 10 is cured in an oven for several hours.

The aforementioned conventional aluminium extrusion electrical isolator is extremely expensive and tedious to manufacture. The present inventor has developed a novel electrical isolator device which is much simpler to manufacture, designed as a self-contained unit, and produced at a substantial savings verses the aluminium extrusion devices.

The present invention does not require the use of costly finned aluminium extrusions as a cooling mechanism. It also overcomes the dangers of exposed aluminium extrusions which can be hazardous to operators if touched during normal operations. The present invention also overcomes the need for the time consuming step of pouring epoxy filler into the central holding area and curing for several hours. Use of an expensive thermally conductive layer is also avoided by the design of the present invention.

The self-contained electrical isolator device of the present invention performs all the same functions of conventional aluminium extrusion devices, i.e., electrical isolation and heat dissipation, but at a substantial savings in both manufacturing cost and time. Furthermore, the present invention is designed such that its heat sink (steel plate) is exposed to the air to allow the dissipation of heat, electrically isolated by a non-conductive housing, and not exposed to operators. This avoids the need for the use of an expensive aluminium extrusion cooling system which is directly exposed to the operator. The non-conductive housing of the present invention also eliminates the need for costly aluminium end caps, epoxy filler (which is both costly and time consuming) and a thermally conductive layer.

Therefore, the present invention provides an electrical isolator which is much simpler to manufacture, includes substantially less parts, less expensive, shorter manufacturing process, easier to handle, light weight, and less hazardous to operators.

The present invention also provides many additional advantages which shall become apparent as described below.

SUMMARY OF THE INVENTION

An electrical isolator device which comprises at least one heat sink (steel plate), and a non-conductive housing which partially encases the heat sink, such that at least one surface of the heat sink is in contact with the non-conductive housing; whereby the surfaces of the heat sink which are not in contact with the non-conductive housing are exposed to the atmosphere to allow dissipation of heat therefrom.

The non-conductive housing is preferably formed by thermoplastic injection molding. The non-conductive housing comprises either a liquid crystal polymer material or polyphenylene sulfide material. The polyphenylene sulfide material may include additives, such as glass and/or minerals.

It is also an object of the present invention to provide an electrical isolator device which is useful in the electrical isolation of multiply batteries from engine alternators. Such an electrical isolator preferably comprises: at least one heat sink (steel plate); at least one electrically conductive member (metal stud), wherein the electrically conductive member is disposed on a surface of the heat sink; at least two diodes, wherein the diodes are disposed on a surface of the heat sink; and a non-conductive housing which partially encases the diodes, electrically conductive member and heat sink, such that at least the surface of the heat sink on which the diodes and electrically conductive member are disposed is in contact with the non-conductive housing; whereby the surfaces of the heat sink which are not in contact with the non-conductive housing are exposed to the atmosphere to allow dissipation of heat therefrom.

Optionally, the electrical isolator device may include two heat sinks. Each heat sink can have any number of diodes and electrically conductive members disposed thereon. For example, if two engine alternators are to be connected to two batteries, then each heat sink would include two diodes and one electrically conductive member disposed thereon. Another example is an electrical isolator used to connect two engine alternators to three batteries would necessitate each heat sink having three diodes and one electrically conductive member disposed thereon.

BRIEF DESCRIPTION OF THE DRAWINGS

FIG. 7 is a schematic representation of a top planar view of an electrical isolator device having a double heat sink with three diodes on each heat sink according to the present invention;

FIG. 8 is a side planar view of the electrical isolator device of FIG. 7;

FIG. 9 is a front planar view with a portion cut-out of the electrical isolator device of FIG. 7;

DESCRIPTION OF THE PREFERRED EMBODIMENTS

The present invention relates to a novel electrical isolator which allows direct connection between an electric current source and a power source. The self-contained electrical isolator device of the present invention performs all the same functions of conventional aluminium extrusions devices, i.e., electrical isolation and heat dissipation, but at substantial savings in both manufacturing cost and time. Furthermore, its heat sink (steel plate) is exposed to the air to allow the dissipation of heat, electrically isolated by a non-conductive housing, and not exposed to operators.

The electrical isolator device of the present invention comprises at least one heat sink (steel plate), and a non-conductive housing which partially encases the heat sink, such that at least one surface of the heat sink is in contact with the non-conductive housing; whereby the surfaces of the heat sink which ar not in contact with the non-conductive housing ar exposed to the atmosphere to allow dissipation of heat therefrom. The electrical isolator device can be used for any suitable electrical isolation application, e.g., as a battery isolator or galvonic isolator. As a battery isolator device it would be disposed between an engine alternator(s) and multiply batteries. Galvonic isolators are typically disposed between an electric current source and a power source.

Figure 1:
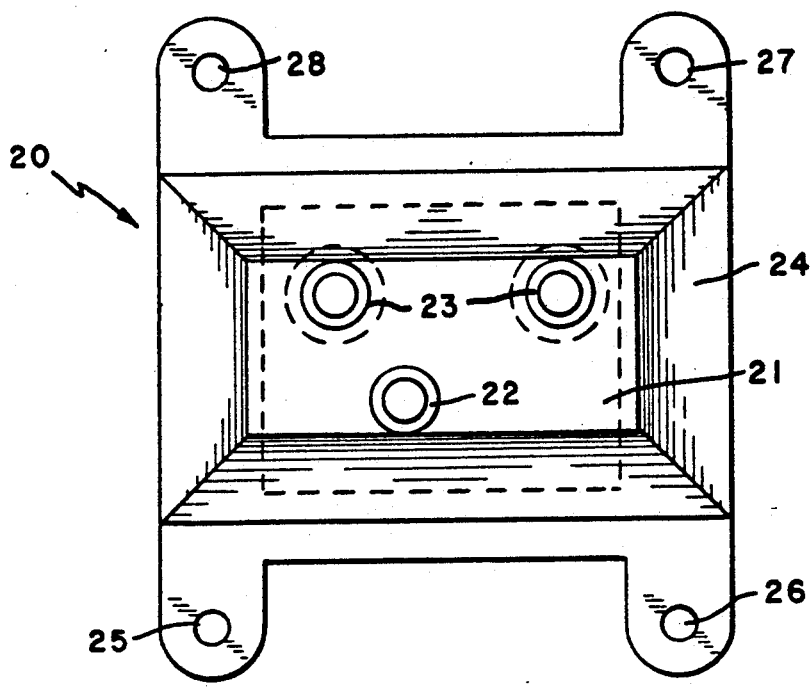
FIG. 1 is a schematic representation of a top planar view of an electrical isolator device having a single heat sink according to the present invention.

The present invention can best be understood by referring to the attached drawings in which FIG. 1 depicts one preferred embodiment of electrical isolator device 20 having a single heat sink (steel plate) 21.

Electrical isolator device 20 includes a heat sink (steel plate) 21 which has at least one electrically conductive member 22, e.g., a metal stud, and at least two diodes 23 disposed on a surface of heat sink 21. Heat sink 21 is preferably a nickel plated steel plate. A non-conductive housing 24 partially encases diodes 23, electrically conductive member 22 and heat sink 21, such that at least the surface of heat sink 21 on which diodes 23 and electrically conductive member 22 are disposed is in contact with non-conductive housing 24. The surfaces of heat sink 21 which are not in contact with non-conductive housing 24 are preferably exposed to the atmosphere to allow dissipation o heat therefrom.

Non-conductive housing 24 is preferably formed by thermoplastic injection molding. That is, after diodes 23 and electrically conductive member 22 are press fit and/or screwed into heat sink 21, the assembly is inserted into a mold for thermoplastic injection molding. Using an engineering thermoplastic with a deflection temperature of at least 500° F. at 264 PSI and a UL 94 rating of V-0, the assembly is run through the cycle and non-conductive housing 24 is formed around the assembly. Non-conductive housing 24 comprises either a liquid crystal polymer material or polyphenylene sulfide material. The polyphenylene sulfide material may include additives, such as glass and/or minerals. These materials require only approximately 1 to 2 minutes to set. It is further contemplated that an other non-conductive material may be used in forming non-conductive housing 24.

The configuration of non-conductive housing 24 can be any suitable design so long as at least one surface of heat sink 21 is in contact with non-conductive housing 24 and the remaining surfaces of heat sink 21 are exposed to the atmosphere. The configuration must also permit all electrically conductive members 22 and at least some diodes 23 to protrude from non-conductive housing 24.

When electrical isolator device 20 is used as a battery isolator electrically conductive member 22 is connected to an engine alternator, not shown, and each diode 23 is connected to a separate battery, not shown. Electrical isolator 20 is secured or mounted to a vehicle or engine block via holes 25, 26, 27 and 28.

Figures 2, 3:
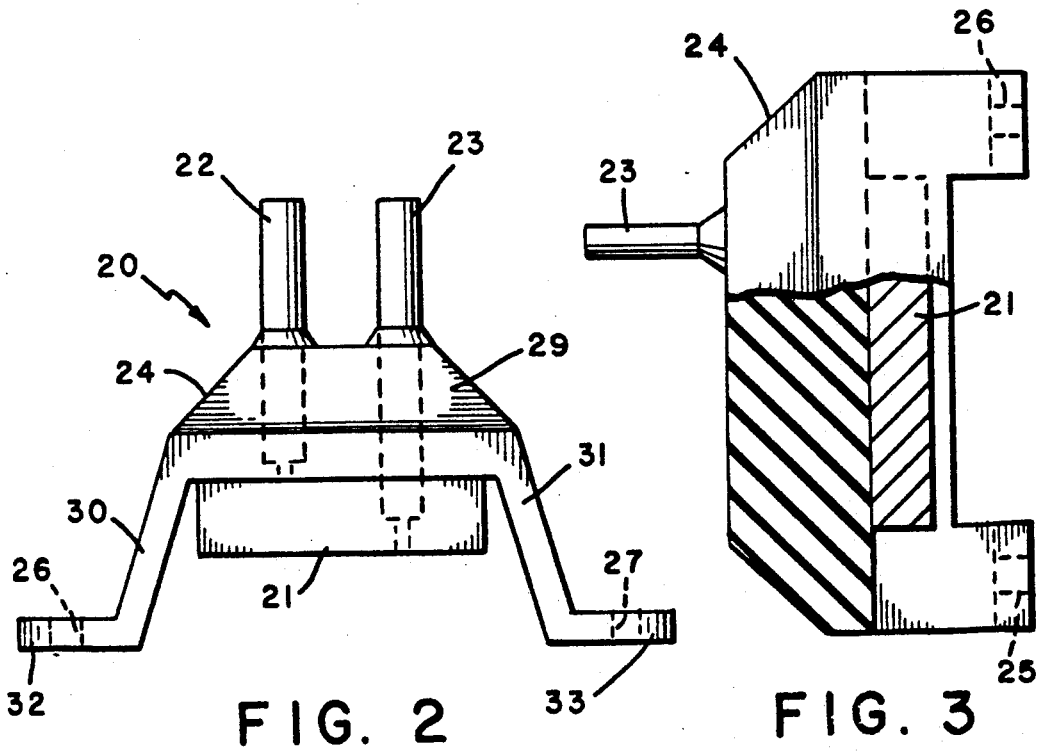
FIG. 2 is a side planar view of the electrical isolator device of FIG. 1.
FIG. 3 is a front planar view with a portion cut-out of the electrical isolator device of FIG. 1.

FIG. 2 depicts a non-conductive housing 24 formed about heat sink 21, wherein non-conductive housing 24 is in contact with at least one surface of heat sink 21 leaving the remaining surfaces exposed to the atmosphere. This configuration allows heat from electrical isolator device 20 to dissipate therefrom via the exposed surfaces of heat sink 21. Non-conductive housing 24 preferably includes a body 29, legs 30 and 31, and bases 32 and 33. The design of nonconductive housing 24 is such that the operator is protected against any incidental contact with heat sink 21 during use. As shown in FIG. 2, electrically conductive member 22 is typically screwed into heat sink 21 and diode 23 is press fit therein. FIG. 3 demonstrates that non-conductive housing 24 shields heat sink 21 to avoid contact with the operator.

Figure 4:
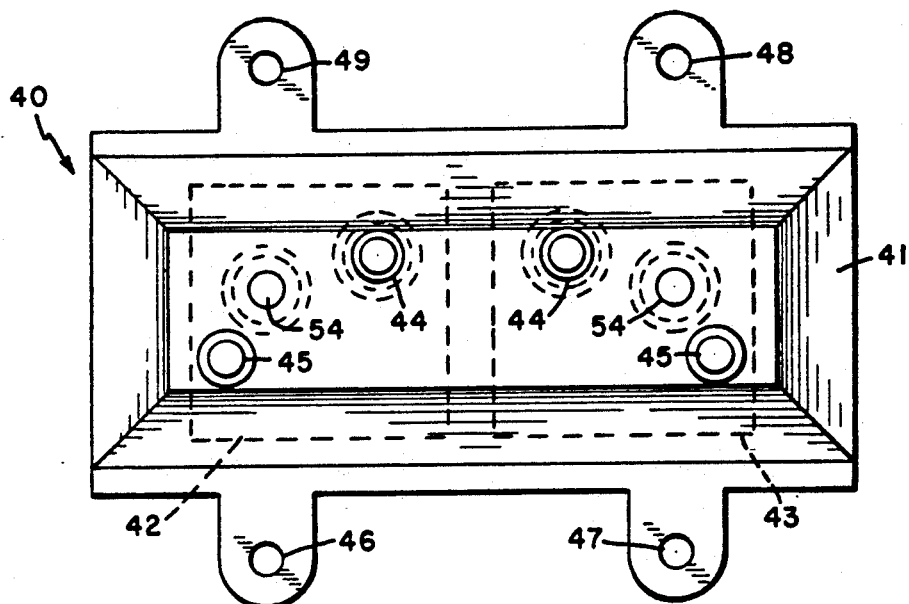
FIG. 4 is a schematic representation of a top planar view of an electrical isolator device having a double heat sink with two diodes on each heat sink according to the present invention.

FIG. 4 depicts another embodiment wherein electrical isolator device 40 with non-conductive housing 41 includes two heat sinks 42 and 43. Each heat sink 42 and 43 can have any number of diodes 44 and 54, and electrically conductive members 45 disposed thereon.

Electrical isolator device 40, shown in FIG. 4, would typically be used when two engine alternators, not shown, are to be connected to two batteries, not shown.

Each heat sink 42 and 43 would have two diodes 44 and 54 electrically connected to one another and one electrically conductive member 45, e.g., a metal stud, disposed thereon. That is, a first engine alternator would be connected to electrically conductive member 45 of heat sink 42 and a second engine alternator would be connected to electrically conductive member 45 of heat sink 43. Similarly, a first battery would be connected to diode 44 on heat sink 42 which is electrically connected to diode 54 on the same heat sink 42. The second battery would be connected in a likewise manner to diode 44 of heat sink 43. Diodes 44 and electrically conductive members 45 typically protrude from non-conductive housing 41; whereas diodes 54 are preferably completely encased within housing 41.

Figure 6:
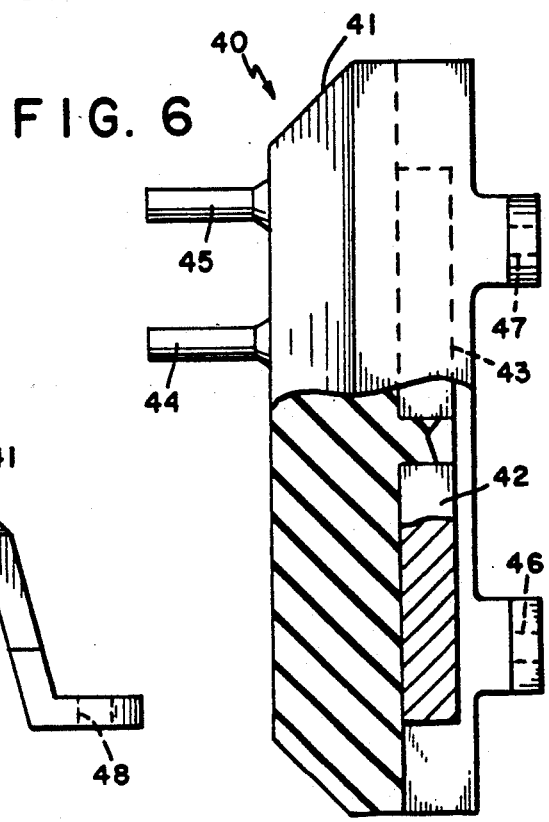
FIG. 6 is a front planar view with a portion cut-out of the electrical isolator device of FIG. 4.
Figure 5:
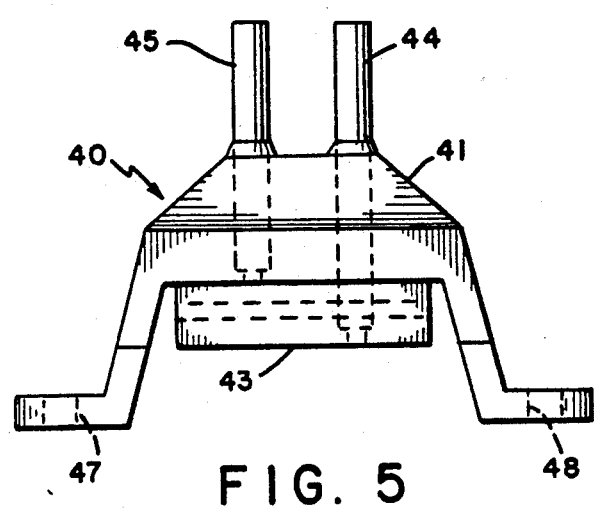
FIG. 5 is a side planar view of the electrical isolator device of FIG. 4.
Figure 10:
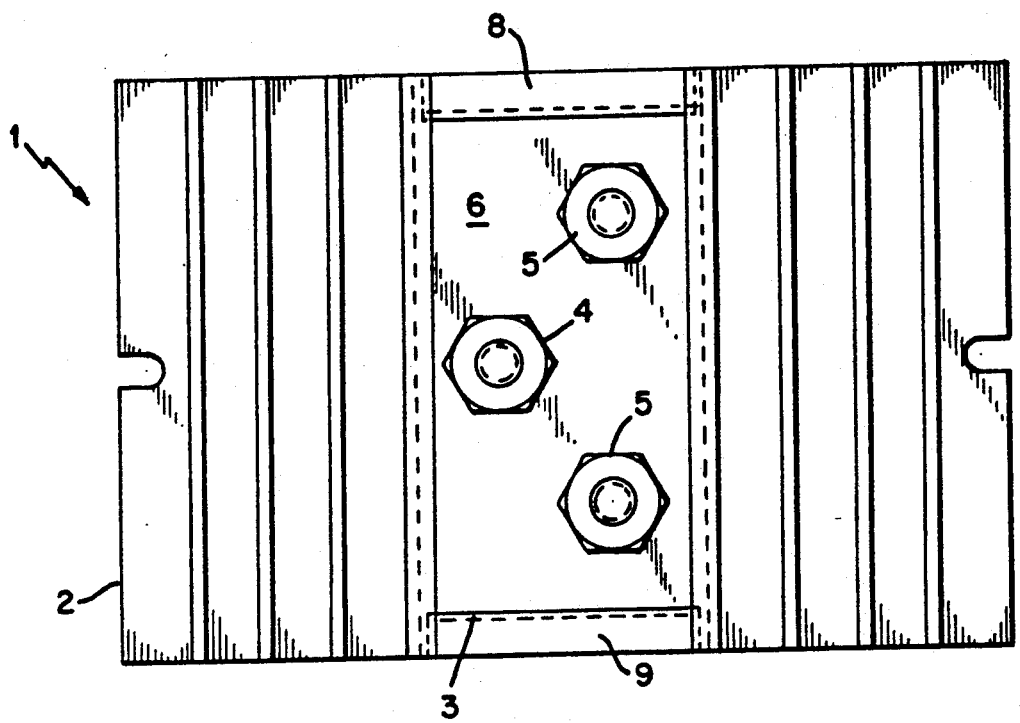
FIG. 10 is a top planar view of a conventional finned anodized aluminium extrusion electrical isolator device.
Figure 11:
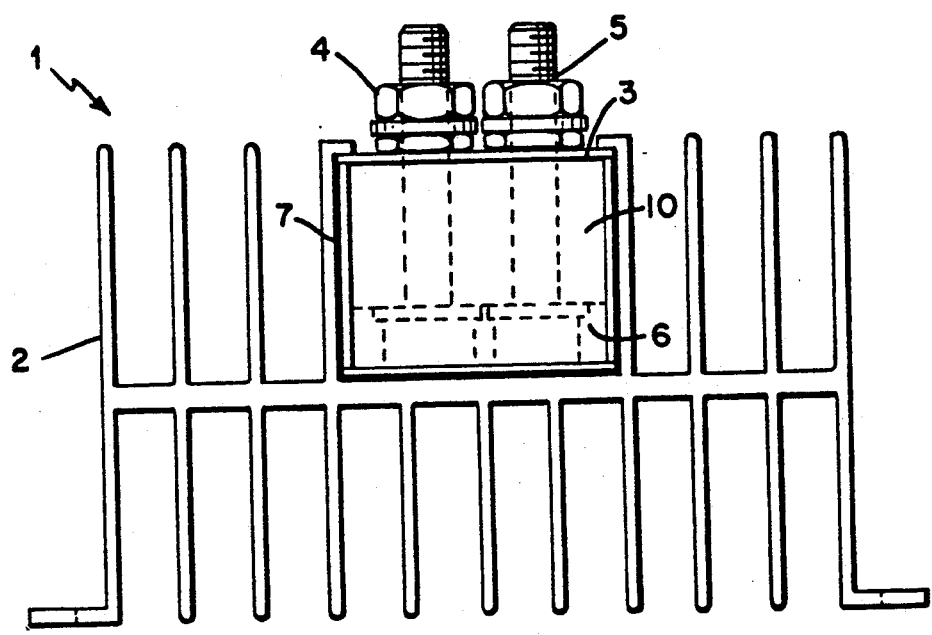
FIG. 11 is a front planar view of a conventional finned anodized aluminium extrusion isolator device of FIG. 10.

Electrical isolator device 40 is mounted to a vehicle or engine via holes 46, 47, 48 and 49. FIG. 5 is a side view and FIG. 6 is a front view of electrical isolator device 40.

Electrical isolator device 60, shown in FIG. 7, would typically be used when two engine alternators, not shown, are to be connected to three batteries, not shown. Each heat sink 62 and 63 would have three diodes 64, 74 and 84, and one electrically conductive member 65, e.g., a metal stud, disposed thereon. That is, a first engine alternator would be connected to electrically conductive member 65 of heat sink 62 and a second engine alternator would be connected to electrically conductive member 65 of heat sink 63. A first battery would be connected to diode 64 on heat sink 62 which is electrically connected to diode 74 on the same heat sink 62. The second battery would be connected in a likewise manner to diode 64 of heat sink 63, wherein diode 64 is electrically connected to diode 74 of heat sink 63. The third battery, not shown, would be connected to either diode 84.

Electrical isolator device 60 is mounted to a vehicle or engine via holes 66, 67, 68 and 69. FIG. 8 is a side view and FIG. 9 is a front view of electrical isolator device 60.

Diodes 64 and 84, and electrically conductive member 65 typically protrude from non-conductive housing 61; whereas diodes 74 are preferably completely encased within housing 61.

While I have shown and described several embodiments in accordance with my invention, it is to be clearly understood that the same are susceptible to numerous changes apparent to one skilled in the art. Therefore, I do not wish to be limited to the details shown and described but intend to show all changes and modifications which come within the scope of the appended claims.

What is claimed is:

1. An electrical isolator device comprising:
   at least one heat sink;
   at least one metal stud, wherein said metal stud is disposed on a surface of said heat sink;
   at least two diodes, wherein said diodes are disposed on a surface of said heat sink; and
   a non-conductive housing which partially encases the diodes, metal stud and heat sink, such that at least the surface of said heat sink on which the diodes and metal stud are disposed is in contact with san nonconductive housing; whereby the surfaces of said heat sink which are not in contact with said non-conductive housing are exposed to the atmosphere to allow dissipation of heat therefrom.

2. The electrical isolator device according to claim 1, wherein said heat sink is a steel plate.

3. The electrical isolator device according to claim 2, wherein said steel plate is plated with nickel.

4. The electrical isolator device according to claim 1, wherein said diodes are press fit into a surface of said heat sink.

5. The electrical isolator device according to claim 1, wherein said metal stud is screwed into a surface of said heat sink.

6. The electrical isolator device according to claim 1, wherein said non-conductive housing is formed by thermoplastic injection molding.

7. The electrical isolator device according to claim 1, wherein said non-conductive housing is formed from a liquid crystal polymer material.

8. The electrical isolator device according to claim 1, wherein said non-conductive housing is formed from a polyphenylene sulfide material.

9. The electrical isolator device according to claim 8, wherein said polyphenylene sulfide material includes glass and/or mineral additives.

10. The electrical isolator device according to claim 1, wherein said metal stud is adapted to be electrically connected to an engine alternator and each diode is adapted to be electrically connected to a separate battery.

11. The electrical isolator device according to claim 1, wherein said electrical isolator device includes a second heat sink.

12. The electrical isolator device according to claim 11, wherein each said heat sink includes two diodes and a metal stud disposed thereon.

13. The electrical isolator device according to claim 11, wherein each said heat sink includes three diodes and a metal stud disposed thereon.

* * * * *